United States Patent [19]

Motley et al.

[11] Patent Number: 4,458,355
[45] Date of Patent: Jul. 3, 1984

[54] ADAPTIVE PHASE LOCK LOOP

[75] Inventors: David M. Motley, Santa Ana; Naif D. Salman, Orange, both of Calif.

[73] Assignee: Hycom Incorporated, Irvine, Calif.

[21] Appl. No.: 272,707

[22] Filed: Jun. 11, 1981

[51] Int. Cl.³ .......................................... H03K 13/32
[52] U.S. Cl. ...................................... 375/82; 375/98; 375/99
[58] Field of Search ....................... 375/57, 58, 98, 99, 375/101, 118, 119, 120, 82, 81; 455/283, 278, 295, 296; 358/167, 36; 328/162, 165, 173, 175; 307/511, 520

[56] References Cited

U.S. PATENT DOCUMENTS

| | | | |
|---|---|---|---|
| 3,848,191 | 11/1974 | Anderson | 375/99 |
| 4,053,932 | 10/1977 | Yamaguti et al. | 328/165 |
| 4,081,837 | 3/1978 | Tada et al. | 455/296 |
| 4,123,710 | 10/1978 | Stuart et al. | 375/18 |
| 4,207,523 | 6/1980 | Acker | 375/58 |
| 4,285,060 | 8/1981 | Cobb et al. | 375/120 |

Primary Examiner—Robert L. Griffin
Assistant Examiner—Stephen Chin
Attorney, Agent, or Firm—Gordon L. Peterson

[57] ABSTRACT

An apparatus for processing an information signal representative of information and containing phase error. The apparatus includes a detector for detecting the information in the signal and an error signal generator for generating an error signal representative of the error. A phase lock loop makes corrections which tend to reduce the phase error. The gain of the phase lock loop is adjusted in accordance with the error signal to optimize system performance.

12 Claims, 7 Drawing Figures

ADAPTIVE PHASE LOCK LOOP

BACKGROUND OF THE INVENTION

Electronic information-carrying signals often include various forms of error or distortion which must be corrected. For example, in the case of a modem, the information signal is transmitted via telephone lines from a transmitter to a receiver and the telephone lines introduce various forms of distortion into the signal.

Phase error is one common form of error existing in the received signal. To reduce the phase error, receivers typically include a phase lock loop which makes phase corrections which tend to reduce or eliminate phase error. Phase lock loops are shown by way of example in Motley et al U.S. Pat. Nos. 3,971,996 and 4,061,977.

Another form of signal distortion is phase jitter which may be considered as incidental frequency modulation. With phase jitter, the phase vector representing the information in the signal shifts. Noise may also be present in the signal.

The amount of signal disturbance resulting from noise and the amount of signal disturbance resulting from phase jitter are variable. Prior art phase lock loops do not provide optimum system performance under all phase jitter and noise conditions.

SUMMARY OF THE INVENTION

Although it is known to provide a phase lock loop with one gain during startup and another gain during normal operation, prior art phase lock loops have a fixed gain during normal operation. With this invention, a phase lock loop is adapted to different phase jitter and noise conditions by adjusting the gain of the phase lock loop during normal operation in a way to provide optimum system performance.

A phase lock loop with a relatively high gain has a greater bandwidth and can be more disturbed by noise than a phase lock loop with a lesser gain and hence lesser bandwidth. Accordingly, for relatively high noise conditions, better performance is achieved with a reduced phase lock loop gain. On the other hand, if the predominant disturbing influnece is phase jitter, then it is desirable to increase the gain of the phase lock loop to reduce the overall system error.

This invention is applicable to any system utilizing a phase lock loop. Although the invention is described with reference to a modem, its use is not limited to modems.

The invention can be embodied in an apparatus for processing an information signal representative of information and containing error. A detector detects the information in the information signal, and an error signal generator responds to the error to provide an error signal. Correction means makes corrections in the information signal tending to reduce the error. A feedback loop feeds at least a portion of the error signal back to the correction means so that the correction means is responsive to the error signal to make corrections in the information signal which tend to reduce the error. Variable gain means is provided in the feedback loop and is responsive to at least a portion of the error signal for adjusting the gain of the feedback loop.

The error signal has a real component EI and an imaginary component EQ. These signal components can be used to indicate the extent to which the sigal is disturbed by phase jitter and noise. Accordingly, the variable gain means may be responsive to the relative values of EI and EQ to make the gain adjustment. Although EI and EQ can be compared in different ways, preferably, the ratio of $\overline{EI^2}$ to $\overline{EQ^2}$ is used to adjust the gain where $\overline{EI^2}$ and $\overline{EQ^2}$ are values of EI and EQ, respectively, which have been squared and then averaged, i.e., square means values. Of course, other predetermined relationships of EI and EQ can be used to make the gain adjustment. Preferably, the gain is adjusted so as to tend to make $\overline{EQ^2} = K\overline{EI^2}$, where K is a constant which is slightly greater than unity. For example, K may equal 1.2.

The invention, together with further features and advantages thereof, may best be understood by reference to the following description taken in connection with the accompanying illustrative drawing.

DESCRIPTION OF THE PREFERRED EMBODIMENT

Figure 1:
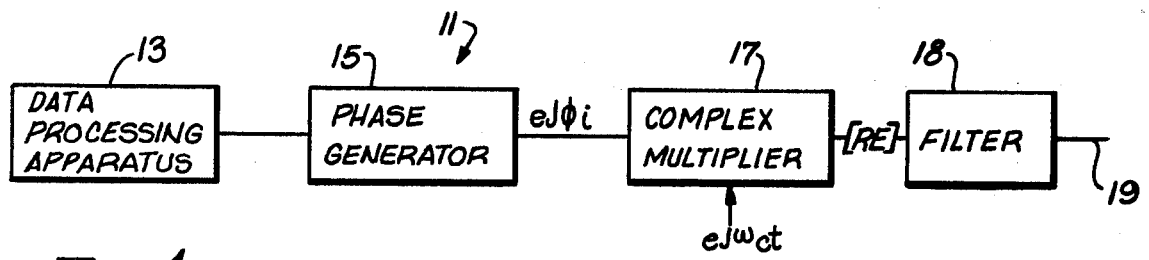
FIG. 1 is a schematic block diagram of a transmitter for transmitting a signal of the type which can be processed by the receiver of this invention.
Figure 2:
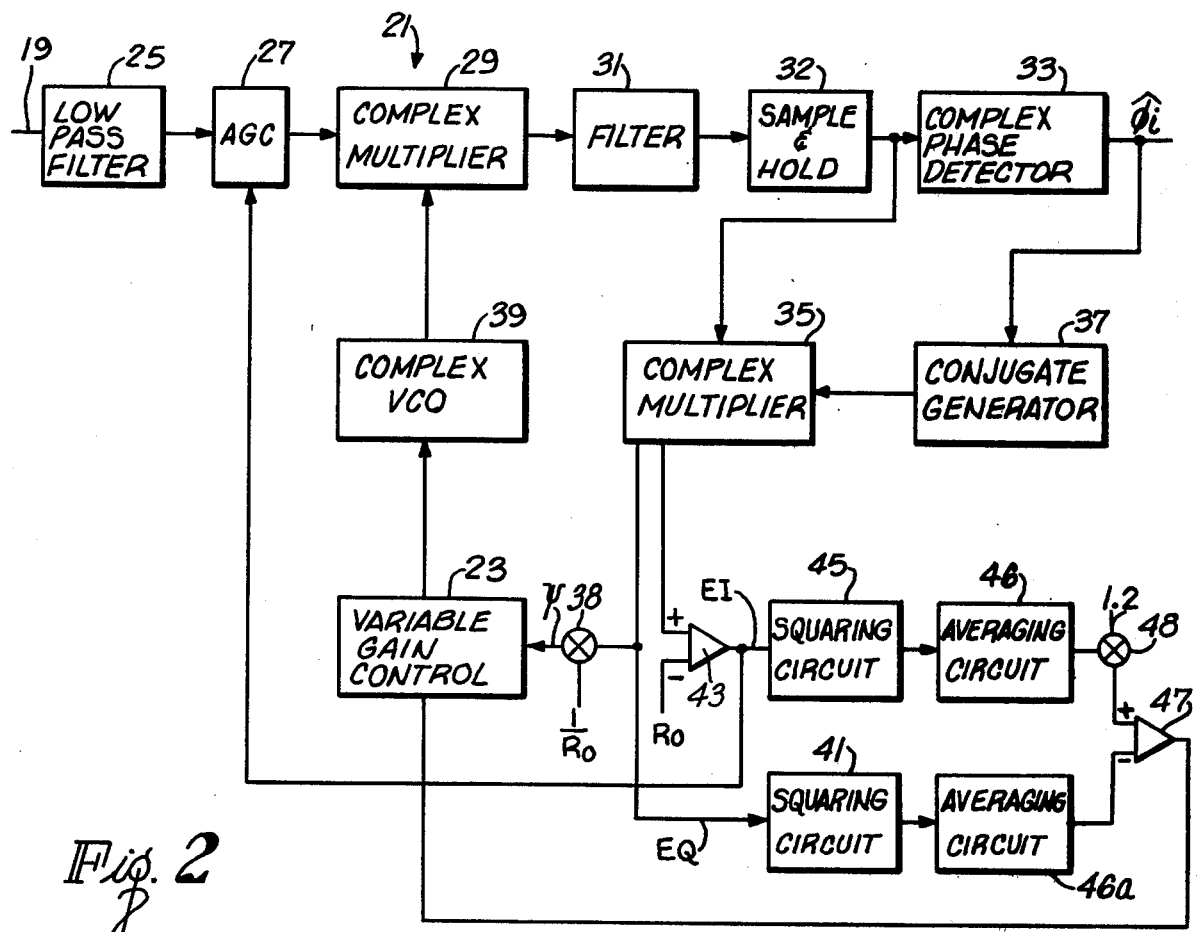
FIG. 2 is a schematic block diagram of a receiver and adaptive phase lock loop constructed in accordance with the teachings of this invention.

FIG. 1 shows a transmitter 11 for transmitting a signal to the receiver of FIG. 2. In the embodiment illustrated, the transmitter 11 is a conventional phase shift key (PSK) transmitter. Although the transmitter 11 is a PSK transmitter, the invention is not limited to PSK and can be used with other modulation techniques, such as quadrature amplitude modulation (QAM).

The transmitter 11 may be conventional and includes a source of information, such as a data processing apparatus 13, which provides digital information or data to a signal encoder which is a phase generator 15. The phase generator 15 encodes the information accordingly in a known manner and provides a phase encoded signal which, in complex notation, can be expressed as $e^{j\phi_i}$ where "e" is approximately 2.71828, "j" equals the $\sqrt{-1}$ and "$\phi_i$" is the phase angle and represents the information to be transmitted. A complex multiplier 17 modulates a carrier signal $e^{j\omega_c t}$ with the encoded signal where "$\omega_c t$" is the radian frequency of the carrier signal. This provides a complex modulated signal, the real component (RE) of which is represented by $S_1/2 \cos(\omega_c t + \phi_i)$, which is the transmitted signal, where $S_1/2$ is the signal power. The imaginary component of the modulated signal is not used. Before transmission, the transmitted signal may be low-pass filtered by a filter 18 and appropriately introduced to a suitable transmission medium, such as telephone lines 19 by suitable data access equipment (not shown).

FIG. 2 shows a receiver 21 which receives an incoming modulated signal having only a real component and represented by K COS $(\omega_c t + \phi_i + \Psi)$, where "K" is a received signal value and "$\Psi$" is some phase error. The receiver 21 includes a variable gain control 23 for a phase lock loop. Except for the presence of the variable gain control 23 and the processing of the error signal to control the variable gain control 23, the receiver 21 can be conventional.

The received signal is introduced to a low-pass filter 25 and then to an automatic gain control 27 (AGC) which selects the desired signal level and thereby removes the received signal value K from the signal. The level of the signal at the output of the automatic gain control 27 is $\hat{R}_o$, and this signal which is represented by the real part of $\hat{R}_o e^{j(\omega_c t + \phi_i + \Psi)}$ is then introduced into a complex multiplier 29 which multiplies the signal by $e^{-j(\omega_c t + \Psi)}$ to provide a signal which, in complex notation, can be represented as $$\frac{R_o}{2} e^{-j(2\omega_c t + \phi_i + 2\Psi)} + \frac{R_o}{2} e^{j\phi_i}.$$

The multiplier 29 also generates real and imaginary components of the signal so that there are two channel outputs, i.e., real and imaginary. Complex multipliers, such as the multiplier 29, are well known and can be implemented in various different ways, such as shown by way of example hereinbelow with reference to FIG. 7.

The multiplied signal is then introduced into a filter 31 which is essentially a low-pass filter having a two-channel input and a two-channel output. The filter 31 eliminates the double frequency terms to provide a filtered demodulated signal $\hat{R}_o e^{j\phi_i}$. The filter 31 filters both the real and imaginary components of the signal and one such filter is shown, for example, as low-pass filters 53 and 55 in Motley et al U.S. Pat. No. 4,061,978.

The filtered demodulated signal is then introduced to a conventional sample and hold 32 which also receives baud timing. The sample and hold 32 has a two-channel input and a two-channel output. The sample and hold 32 samples the filtered demodulated signal in each channel at intervals determined by the baud timing and provides, in response to each sample, a constant amplitude, output signal in each channel which is representative of the associated sample input signal. Thus, the amplitude of the output of the sample and hold 32 may change with each sample but, between samples, the output amplitude is fixed. Appropriate baud timing may be selected by those skilled in the art and may be, for example, 1600 bauds per second.

The output from the sample and hold 32 is then introduced into a complex phase detector 33 and into a complex multiplier 35, both of which are conventional. The phase detector 33 is responsive to the signal from both channels of the sample and hold 32 to detect the phase of the filtered and demodulated signal. The phase $\hat{\phi}_i$ represents the receiver's estimate of the transmitted information $j\phi_i$ and is the detected signal. Each of the samples taken by the sample and hold can be represented by a vector, with the length of the vector representing signal level and with the angular orientation of the vector about an origin representing the phase. The complex phase detector 33 detects, in effect, the position of the vector, with any vector lying within a first predetermined zone being detected as $\hat{\phi}_0$, any vector lying within a second predetermined zone being detected as $\hat{\phi}_1$ and so on. For example, in a four-vector system, any vector in the first quadrant, i.e., between 0 and 90 degrees, is detected as $\hat{\phi}_0$. Thus, the complex phase detector has a finite number of discrete output signals, each of which is representative of the phase of the transmitted signal. Various phase detection schemes are discussed in the patented literature, and by way of example, an eight-vector system and a suitable phase detector are disclosed in Motley et al U.S. Pat. No. 3,988,539. For simplicity, it is assumed that the phase error $\Psi$ is sufficiently small such that the phase detector can make correct phase detection decisions. Of course, conventional start-up techniques to bring the system into synchronization can be employed, if desired.

The detected signal $\hat{\phi}_i$ may be provided to a decoder (not shown) and then to a data processing apparatus or otherwise used in a conventional manner. In addition, the detected signal $\hat{\phi}_i$ is provided to a conjugate generator 37 which may include, for example, a sine-cosine, read-only memory (ROM). The detected signal $\hat{\phi}_i$ has any one of a finite number of discrete values, and the conjugate generator 37 has an identical number of discrete outputs, with such outputs representing the conjugates, respectively, of the inputs. The conjugate generator 37, in response to the detected signal $\hat{\phi}_i$ generates a conjugate signal which is the conjugate of the detected signal $\hat{\phi}_i$ introduced to the generator 37. In complex notation, the detected signal $\hat{\phi}_i$ can be expressed as $e^{j\hat{\phi}_i}$ and the conjugate of that signal, i.e., the conjugate signal generated by the conjugate generator 37 can be expressed in complex notation as $e^{-j\hat{\phi}_i}$. Graphically, the multiplication of the sample and hold output signal by the conjugate of the detected signal has the effect of rotating the sample and hold signal vector from its true position back to the origin, with any imaginary deviation from the origin representing the phase error. The conjugate generator 37 provides a two-channel output to the multiplier 35.

The complex multiplier 35 multiplies the conjugate signal $e^{-j\hat{\phi}_i}$ by the filtered demodulated signal $\hat{R}_o e^{j(\phi_i + \Psi)}$ to produce $\hat{R}_o e^{j(\phi_i + \Psi)} e^{-j\hat{\phi}_i} = \hat{R}_o e^{j\Psi}$ which is the complex error function from which the complex error signal can be derived. The complex multiplier 35 may be, for example, identical to the complex multiplier 29 in that it multiplies two complex quantities together to produce a complex output signal.

The complex error function has an imaginary component ([IM]) which equals $\hat{R}_o \sin \Psi$ which for small phase error angles $\Psi$ approximately equals $\hat{R}_o \Psi$. This is also the imaginary component of the system error signal. A multiplier 38 multiplies the imaginary component of the error signal function by $1/R_o$ where, $\hat{R}_o \sim R_o$, and $R_o$ is a reference level representing the desired signal level after the AGC 27, to remove the effects of signal amplitude on the phase lock loop. This provides a phase lock loop (PLL) error signal which is approximately $\Psi$, the phase error of the input signal which is updated each baud. The PLL error signal is applied to the variable gain control 23 which controls the gain of the PLL. The output of the variable gain control 23 is applied to a voltage controlled oscillator (VCO) 39 to produce the signal $e^{-j(\omega_c t + \Psi)}$. The VCO 39 is of the conventional type which receives a real input and provides both real and imaginary outputs and, for this purpose, it includes a sine-cosine ROM, with the sine and cosine outputs being for the imaginary and real channels, respectively. When the output of the VCO 39 is complex multiplied by $\hat{R}_o e^{j(\omega_c t + \phi_i + \Psi)}$ in the complex multiplier 29, the signal $$\frac{\hat{R}_o}{2} e^{-j(2\omega ct + \phi i + 2\Psi)} + \frac{\hat{R}_o}{2} e^{j\phi i}$$

is produced, which after filtering produces the desired demodulated signal $\hat{R}_o e^{j\phi i}$.

This invention provides for controlling the gain of the variable gain control 23 to controlled the portion of the PLL error signal $\Psi$ that is applied to the VCO 39. To accomplish this, EQ, which equals $\hat{R}_o$ SIN $\Psi$ and which is the imaginary portion of the error signal, is applied to a squaring circuit 41 to rectify the signal. The real component of the error function is $\hat{R}_o$ COS $\Psi$. Because $\Psi$ is a small angle, COS $\Psi$ has a value close to unity and $\hat{R}_o$ COS $\Psi \sim \hat{R}_o$. The real component of the error function and the reference level $R_o$ is applied to a subtractor 43 which substracts $R_o$ from the real component of the error function. $\hat{R}_o - R_o$ represents the difference between the actual and desired signal levels and is used to adjust the AGC 27 accordingly. Also, the output of the subtractor 43 constitutes the real component EI of the error signal, i.e., EI $\sim \hat{R}_o - R_o$. Thus, the system error signal comprises the imaginary output of the multiplier 35 (EQ) and the output of the subtractor 43 (EI).

The real component of the error signal EI is squared by a squaring circuit 45 and hence rectified and applied to an averaging circuit 46. Similarly, the squared value of the imaginary value of the error signal EQ$^2$ is applied to an identical averaging circuit 46a. The averaging circuits 46 and 46a average their respective inputs and provide square mean values $\overline{EI^2}$ and $\overline{EQ^2}$, respectively. For example, for baud timing of 1600 bauds per second, the averaging circuits 46 and 46a are each provided with 1600 values of EI$^2$ and EQ$^2$ per second. The averaging circuits 46 and 46a may average these samples over any desired length of time, such as one second. The averaging circuits 46 and 46a can be implemented in any suitable manner and each of them may be, for example, a low-pass filter with approximately one hertz bandwidth.

$\overline{EQ^2}$ is applied directly to a comparator 47, and $\overline{EI^2}$ is multiplied by constant in a multiplier 48 and then introduced to the comparator. The comparator 47 compares $\overline{EQ^2}$ with $\overline{KEI^2}$, where "K" is a constant provided by the multiplier 48. Although "K" may be unity, it is preferably slightly greater than unity, and in the embodiment illustrated, $\overline{EI^2}$ is multiplied by a constant of 1.2 by the multiplier 48 so that the comparator 47 compares 1.2 $\overline{EI^2}$ to $\overline{EQ^2}$. This ratio is used by the comparator 47 to provide a gain control signal to the variable gain control 23 to control its gain.

Generally, if $\overline{EQ^2}$ is greater than 1.2 $\overline{EI^2}$ the predominant disturbing influence on the signal is phase jitter, and the gain should be increased. On the other hand, if the signal is predominantly disturbed by the noise, 1.2 $\overline{EI^2}$ will be greater than $\overline{EQ^2}$ and the gain should be reduced.

The output of the comparator 47 is binary, and thus, either calls for an increase or decrease in the gain of the variable gain control 23. The output of the comparator 47 is updated, for example, every second, which is much less frequently than the sampling rate of the sample and hold 32. Acccordingly, the PLL error signal is updated every baud, but the gain of the variable gain control is updated much less frequently.

Figure 3:
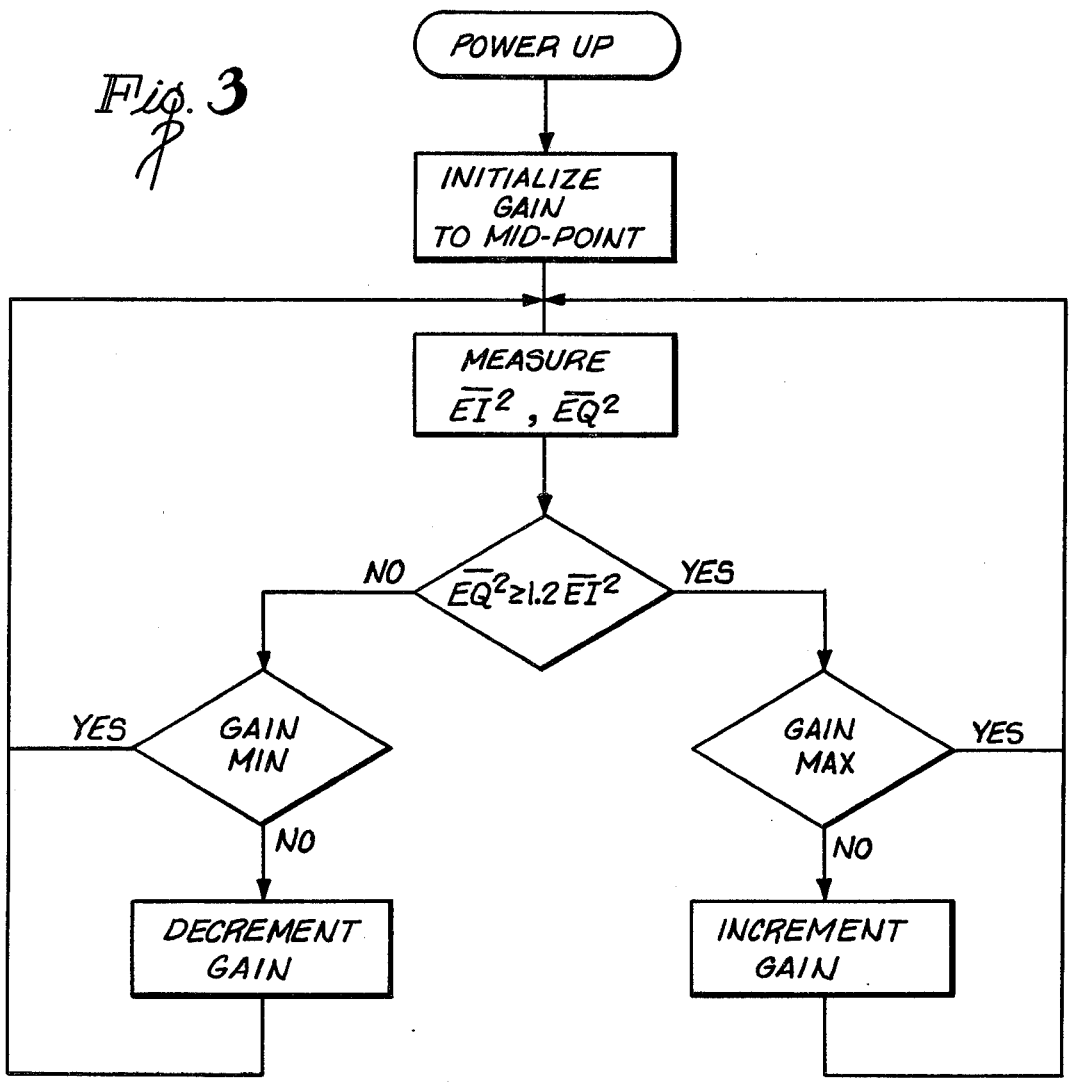
FIG. 3 is a gain adjust flow chart illustrating one way in which the gain of the phase lock loop can be controlled as a function of the error signal.

The variable gain control 23 may have any suitable range of gains. For example, the variable gain control 23 may have a nominal gain of one, a maximum gain of four and a minimum gain of $\frac{1}{4}$, with the gain being suitably incrementally adjustable within this range. FIG. 3 is a flow chart showing operation of the system in controlling the gain of the variable gain control 23. Upon start-up, the gain of the variable gain control 23 is automatically set to its midpoint, i.e., a gain half way between the maximum and minimum gains. Thereafter $\overline{EI^2}$ are measured and compared by the comparator 47. If $\overline{EQ^2}$ is greater than 1.2 $\overline{EI^2}$ and if the gain of the variable gain control 23 is not already at maximum, the gain of the gain control 23 is incremented. Conversely, if $\overline{EQ^2}$ is not greater than 1.2 $\overline{EI^2}$ and if the gain of the gain control 23 is not set at the minimum gain, the gain is decremented. If the gain is at the maximum allowable setting, no further gain increases are obtained, and conversely, if gain is at the minimum allowable value, no further reduction in gain is possible.

Figure 4:
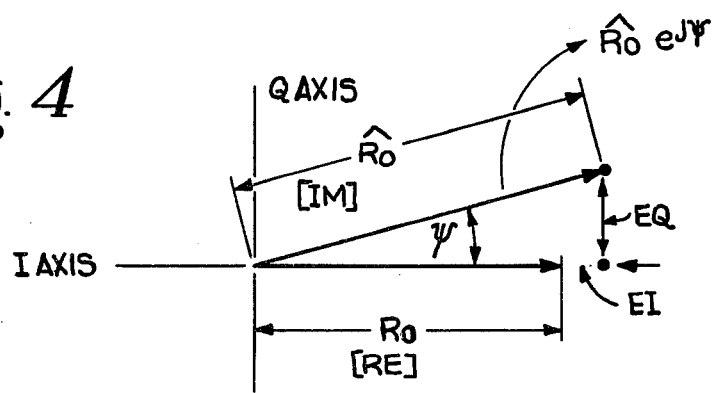
FIG. 4 is a plot showing how components of the error signal are derived.

FIG. 4 shows the relationship between error signal components EI and EQ, the amplitude of the desired signal $R_o$, the amplitude of the receive signal $\hat{R}_o$ and the received signal following filtering by the filter 31 $\hat{R}_o e^{j\Psi}$. More specifically, FIG. 4 shows how the error signals EI and EQ can be derived. In FIG. 4, the real [RE] axis is the I axis and the imaginary [IM] axis is the Q axis, and $R_o$ is rotated to the origin. The phase error $\Psi$ of the received signal is shown as the angle between $R_o$ and the vector representing the received signal after filtering $\hat{R}_o e^{j\Psi}$.

More particularly, it can be seen from FIG. 4 that the imaginary component of the error signal is EQ=-$[IM]\hat{R}_o e^{j\Psi} = R_o$ SIN $\Psi$, and the error signal in the I axis, i.e., the real component of the error signal is EI=[-$RE]\hat{R}_o e^{j\Psi} - \hat{R}_o = R_o$ COS $\Psi - R_o$. As shown by this equation, to obtain the real component EI of the error signal, it is necessary to subtract $R_o$ in the subtractor 43.

Figure 5:
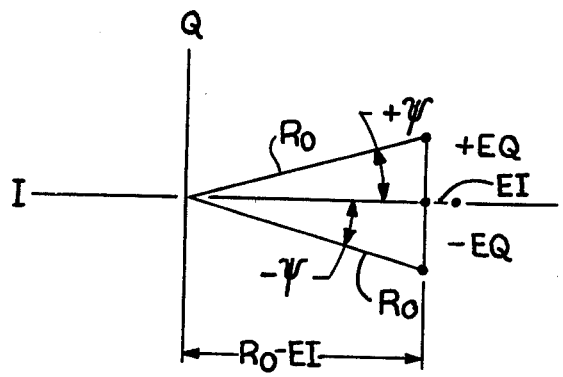
FIG. 5 is a plot illustrating a signal disturbed by phase jitter, with the length of the error signal component, EI, exaggerated for clarity.
Figure 6:
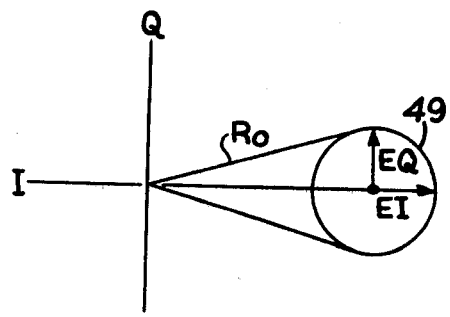
FIG. 6 is a plot of a signal disturbed by noise.

FIGS. 5 and 6 show how the signals EI and EQ can serve as indicators of whether a signal is disturbed primarily by phase jitter or noise, and consequently, whether the phase lock loop gain is set at the optimum value. FIG. 5 illustrates by way of example a signal vector rotated to the origin and disturbed only by uncorrected phase error $\Psi$ which causes the signal vector $R_o$ to move through an angle which is plus or minus $\Psi$. For this illustration, it can be assumed that $\hat{R}_o$ equals $R_o$. EI and EQ represent the difference between the corrected and uncorrected signal as shown in FIG. 5. From FIG. 5, it can be seen that EI=$R_o$(COS$\Psi$-1) and EQ=$R_o$SIN$\Psi$.

Assuming that the uncorrected phase error $\Psi$ is approximately ten degrees, then EQ shown in FIG. 5 is approximately ten times as large as EI as shown by the following:

$$EI = [COS(10°) - 1]R_o \approx 1.5 \times 10^{-2} R_o$$

$$EQ = R_o \text{ SIN } 10° \approx 1.74 \times 10^{-1} R_o$$

Thus, the square mean values of EI and EQ can be used to detect the presence of a signal predominantly disturbed by phase jitter, and the PLL gain can be increased accordingly.

If, on the other hand, the signal is predominantly disturbed by noise, the error signal at the output of the multiplier 35 is $R_o e^{j\Psi} + n(t)$, where n(t) indicates noise which varies with time. Then assuming that $R_o$ equals $\hat{R}_o$ and that the phase error $\Psi$ is 0, then:

$$EI = R_o \text{ COS } 0° - R_o + nI(t) = nI(t)$$

$$EQ = R_o \operatorname{SIN} 0° + nQ(t) = nQ(t),$$

where nI(t) and nQ(t) are noise in the I and Q channels, respectively. In general, with random noise, nI(t) and nQ(t) are approximately independent Gaussian random variables, with zero mean and equal variances. EI and EQ when rectified and averaged should have approximately equal statistical values. Assuming the radius of a circle 49 defines the standard deviation of the noise, then approximately 68.27 percent of the signals containing noise can be expected to lie within that circle. When EI and EQ are approximately equal, they can be used to indicate the presence of a signal predominantly disturbed by noise.

The correct gain setting for the variable gain control is the least gain which produces approximately equal EI and EQ values. To make certain that the gain is held to a minimum, it is preferred to increment gain only if the square mean value of EQ exceeds some constant times the square mean value of EI and, as discussed hereinabove, such constant may be of the order of 1.2.

Figure 7:
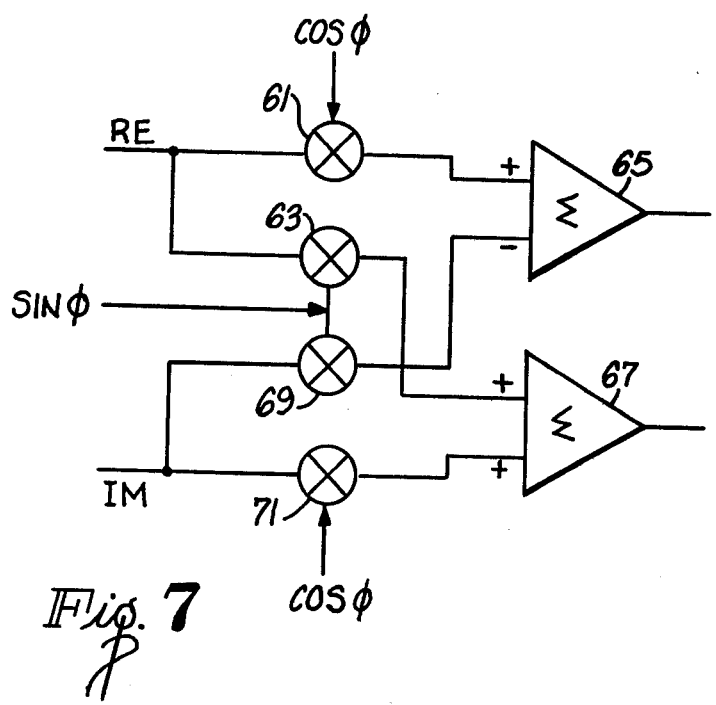
FIG. 7 shows by way of example one way in which the complex multiplier 29 may be implemented.

FIG. 7 shows, by way of example, one way in which the complex multiplier 29 can be implemented. The complex multiplier 29 has real and imaginary channels for receiving the real component (RE) and the imaginary component (IM), respectively, of the signal from the AGC 27. The VCO 39 provides cosine $\phi$ and sine $\phi$ outputs in the real and imaginary channels, respectively, and provides these signals to the complex multiplier 29 as shown in FIG. 7. Thus, the real component of the signal received from the AGC 27 is multiplied by cosine $\phi$ in a multiplier 61 and by sine $\phi$ in a multiplier 63, and these two products are then introduced into positive terminals of adders 65 and 67, respectively, located in the real and imaginary channels. Similarly, the imaginary component is multiplied by sine $\phi$ in a multiplier 69 and by cosine $\phi$ in a multiplier 71, and these products are introduced to a negative terminal of the adder 65 and a positive terminal of the adder 67, respectively. In the embodiment illustrated, only the real component of the signal is transmitted and so the imaginary component of the signal from the AGC is 0. However, the adders 65 and 67 provide outputs in the two channels, respectively, and this output can be expressed in complex notation as indicated above. If desired, the complex multiplier 35 may be identical to the multiplier 29 of FIG. 7 in which case the sine/cosine inputs are obtained from the conjugate generator 37.

Although an exemplary embodiment of the invention has been shown and described, many changes, modifications and substitutions may be made by one having ordinary skill in the art without necessarily departing from the spirit and scope of this invention.

We claim:

1. An apparatus for processing an information signal representative of information and containing error, including phase error, wherein a detector detects the information in the signal, an error signal representative of the error is generated and a phase lock loop is responsive to at least a portion of the error signal to tend to reduce the phase error, the improvement comprising:

variable gain means for adjusting the gain of the phase lock loop;

gain control means in the phase lock loop responsive to at least a portion of the error signal for providing a gain adjustment signal to the variable gain means to adjust the gain of the latter; and said gain control means increases the gain of the variable gain means in response to phase jitter having a greater influence on the error signal than noise has on the error signal.

2. An apparatus for processing an information signal representative of information and containing error, including phase error, wherein a detector detects the information in the signal, an error signal representative of the error is generated and a phase lock loop is responsive to at least a portion of the error signal to tend to reduce the phase error, the improvement comprising:

variable gain means for adjusting the gain of the phase lock loop;

gain control means in the phase lock loop responsive to at least a portion of the error signal for providing a gain adjustment signal to the variable gain means to adjust the gain of the latter; and the error signal having a real component EI and an imaginary component EQ and said gain control means being responsive to the value of EI relative to the value of EQ for providing the gain adjustment signal.

3. An apparatus as defined in claim 2 including means for providing square mean values of EI and EQ and wherein said gain control means adjusts the gain in response to the square mean values of EI and EQ.

4. An apparatus for processing an information signal representative of information and containing error, said apparatus comprising:

error signal generating means responsive to the error to provide an error signal;

correction means for making corrections in said information signal tending to reduce the error;

a feedback loop for feeding at least a portion of the error signal back to the correction means whereby the correction means is responsive to the error signal to make corrections in the information signal which tend to reduce the error;

variable gain means in said feedback loop for adjusting the gain of the feedback loop;

gain control means responsive to at least a portion of the error signal to control the gain of the variable gain means; and means responsive to the correction means for detecting the information in the information signal.

5. An apparatus as defined in claim 4 including means responsive to at least a portion of the error signal to provide a phase lock loop error signal and to apply such phase lock loop error signal to the feedback loop.

6. An apparatus as defined in claim 4 wherein said error includes phase error and the correction means reduces the phase error.

7. An apparatus as defined in claim 4 wherein said error includes phase jitter and noise and the gain control means is responsive to the error signal for increasing the gain of the variable gain means in response to the phase jitter having a greater influence on the error signal than the noise.

8. An apparatus as defined in claim 4 wherein the error signal has a real component EI and an imaginary component EQ and said gain control means is responsive to the relative values of EI and EQ for adjusting the gain of the variable gain means.

9. An apparatus as defined in claim 8 including means for providing the ratio of the square values of EI and EQ and wherein said gain control means adjusts the gain of the variable gain means in response to the ratio of the square mean values of EI and EQ.

10. An apparatus as defined in claim 4 wherein the error signal has real and imaginary components and said apparatus includes means for providing square mean values of the real and imaginary components and said gain control means adjusts the gain of the variable gain means to tend to cause the square mean values of the real and imaginary components to bear a predetermined relationship to each other.

11. An apparatus as defined in claim 10 wherein the predetermined relationship is that the square mean value of the imaginary component is approximately equal to 1.2 times the square mean value of the real component.

12. An apparatus as defined in claim 4 wherein the apparatus is a receiver and the information signal is a modulated signal, said apparatus further comprising demodulator means for demodulating the modulated signal to provide a demodulated signal, said detecting means includes phase detector means for detecting the phase of the demodulated signal to provide a phase detected signal, and said error signal generating means is responsive to the demodulated signal and the phase detected signal to provide said error signal.

* * * * *